US011456175B2

(12) United States Patent
Alfieri et al.

(10) Patent No.: US 11,456,175 B2
(45) Date of Patent: Sep. 27, 2022

(54) METHOD OF MAKING A SILICON CARBIDE ELECTRONIC DEVICE

(71) Applicant: Hitachi Energy Switzerland AG, Baden (CH)

(72) Inventors: Giovanni Alfieri, Baden (CH); Vinoth Sundaramoorthy, Wettingen (CH)

(73) Assignee: Hitachi Energy Switzerland AG, Baden (CH)

( * ) Notice: Subject to any disclaimer, the term of this patent is extended or adjusted under 35 U.S.C. 154(b) by 87 days.

(21) Appl. No.: 17/166,181

(22) Filed: Feb. 3, 2021

(65) Prior Publication Data

US 2021/0242021 A1 Aug. 5, 2021

(30) Foreign Application Priority Data

Feb. 3, 2020 (EP) .................................... 20155173

(51) Int. Cl.
    *H01L 21/04* (2006.01)
    *H01L 29/16* (2006.01)
    *H01L 29/45* (2006.01)
    *H01L 29/868* (2006.01)

(52) U.S. Cl.
    CPC ........ *H01L 21/046* (2013.01); *H01L 21/0485* (2013.01); *H01L 29/1608* (2013.01); *H01L 29/45* (2013.01); *H01L 29/868* (2013.01)

(58) Field of Classification Search
    CPC ... H01L 21/04; H01L 21/046; H01L 21/0485; H01L 21/2236; H01L 29/16; H01L 29/1608; H01L 29/45; H01L 29/868

USPC ......................................................... 438/523
See application file for complete search history.

(56) References Cited

U.S. PATENT DOCUMENTS

| 5,087,576 A | 2/1992 | Edmond et al. |
| 5,409,859 A | 4/1995 | Glass et al. |
| 6,406,998 B1 | 6/2002 | Prall et al. |
| 2008/0003793 A1* | 1/2008 | Herner ............... H01L 21/2254 438/597 |
| 2011/0056542 A1 | 3/2011 | Quick et al. |
| 2019/0019679 A1 | 1/2019 | Iguchi et al. |

FOREIGN PATENT DOCUMENTS

| CN | 111785620 | * 10/2020 |
| JP | S6439721 A | 2/1989 |
| JP | H06326314 A | 11/1994 |

(Continued)

OTHER PUBLICATIONS

Johnson, Brian J., et al., "Mechanism of ohmic behavior of Al/Ti contacts to p-type 4H-SiC after annealing", Journal of Applied Physics, vol. 95, No. 10, May 15, 2004, pp. 5616-5620.

(Continued)

*Primary Examiner* — Fazli Erdem
(74) *Attorney, Agent, or Firm* — Slater Matsil, LLP (57) ABSTRACT

A method for forming a semiconductor device includes implanting first ions and second ions into a p-type silicon carbide layer from a first main side to form an implantation layer at the first main side. The implanting is performed by plasma immersion ion implantation in which the p-type silicon carbide layer is immersed in a plasma comprising the first ions and the second ions. The first ions can be ionized aluminum atoms and the second ions are different from the first ions.

23 Claims, 4 Drawing Sheets

(56) References Cited

FOREIGN PATENT DOCUMENTS

| JP | H0982663 A | 3/1997 |
|---|---|---|
| JP | 2004158702 A | 6/2004 |
| JP | 2012510717 A | 5/2012 |
| JP | 2019021689 A | 2/2019 |
| WO | 2019166576 A1 | 9/2019 |

OTHER PUBLICATIONS

Koizumi, Atsushi, et al., "Temperature and doping dependencies of electrical properties in Al-doped 4H-SiC epitaxial layers", Journal of Applied Physics, 106(1), 013716, Jul. 2009.

Japanese Patent Office, Office Action issued in Japanese Application No. 2021-008762, dated Jul. 13, 2021, 15 pages total.

Okuyama, Y., et al., "Formation of Shallow SiC-pn Junction by Excimer Laser Doping" 30p-ZW-4, Department of Electrical and Computer Engineering Nagoya Institute of Technology, 3 total pages, Oct. 2000.

Yoshida, K., et al., "Fabrication of NiAl onmic contact to n-type and p-type SiC" 5p-ZB-10, Department of Electrical and Computer Engineering Nagoya Institute of Technology, 3 total pages, Apr. 1995.

Crofton, J., et al., "Titanium and Aluminum-Titanium Ohmic Contacts to p-type SiC", Solid-State Electronics, vol. 41, No. 11, Feb. 19, 1997, pp. 1725-1729.

La Via, F., et al., "Ohmic contacts to SiC", International Journal of High Speed Electronics and Systems, Jun. 2006, 36 pages.

Lundberg, N., et al., "Thermally Stable Low Ohmic Contact to p-type 6H-SiC Using Cobalt Silicides", Solid-State Electronics, vol. 39, No. 11, Apr. 4, 1996, pp. 1559-1565.

Sakai, T., et al., "Ternary TiAlGe ohmic contacts for p-type 4H-SiC", American Institute of Physics, Journal of Applied Physics, vol. 95, No. 4, Feb. 15, 2004, 4 pages.

Vassilevski, K., et al., "Phase formation at rapid thermal annealing of Al/Ti/Ni ohmic contacts on 4H-SiC", Materials Science and Engineering B80, 2001, pp. 370-373.

* cited by examiner

METHOD OF MAKING A SILICON CARBIDE ELECTRONIC DEVICE

CROSS-REFERENCE TO RELATED APPLICATIONS

This application claims priority to European Patent Application No. 20155173.6, filed on Feb. 3, 2020, which application is hereby incorporated herein by reference.

TECHNICAL FIELD

The disclosure relates to a method of making a silicon carbide electronic device.

BACKGROUND

It is well known that silicon carbide (SiC) possesses attractive chemical, physical, and electronic properties for high-power, high-temperature, and high-frequency electronic devices. In particular, a higher electric breakdown field strength, a higher thermal conductivity, a lower intrinsic carrier concentration and a higher saturated drift velocity in the 4H-polytype of silicon carbide (4H—SiC) and in the 6H-polytype of silicon carbide (6H—SiC) compared to the corresponding values in silicon (Si) make 4H—SiC and 6H—SiC favorable materials for power semiconductor devices.

In order to be able to use silicon carbide in electronic devices, or to connect such devices into electrical circuits, appropriate contacts must be made between the silicon carbide and the metals (e.g., printed circuits, wires, or any other appropriate metal elements) used to carry current. Appropriate contacts allow charge to flow easily in both directions between the metal and the silicon carbide, without blocking due to rectification or excess power dissipation due to voltage thresholds. Such contacts are known as ohmic contacts. Ohmic contacts are characterized by having a linear and symmetric current-voltage characteristic for positive and negative applied voltages and a relatively low resistance. Conversely, a Schottky contact has rectifying properties and allows current flow only for one polarity.

Whether a junction between a metal and a semiconductor behaves as an ohmic contact depends on the height of the Schottky barrier (contact potential), which sets the threshold for the excess energy an electron requires to pass from the semiconductor to the metal. To form an excellent ohmic contact, the Schottky barrier must be minimized, which requires matching the work function of the contact metal to the work function of the semiconductor. More specifically, in order to act as an ohmic contact to a particular semiconductor, the work function of the contact metal should ideally be greater than the electron affinity and the bandgap of the semiconductor.

Silicon carbide has a wide band gap in the range from about 2.8 electron volts (eV) to 3.3 eV for the common polytypes and a high electron affinity of around 4 eV. Thus, its work function is large with values of 6 eV and above, depending on the carrier concentration. In contrast, most metals have a work function in the range from 4 eV to 5.5 eV. Contacts formed by depositing a metal layer on silicon carbide therefore generally result in a residual Schottky barrier height with values of 1 eV and above and thus have a non-ohmic behavior. The same problems exist for other wide bandgap semiconductor materials such as zinc selenide (ZnSe), gallium nitride (GaN), diamond, boron nitride (BN), gallium phosphide (GaP), and aluminum nitride (AlN).

The method for forming an ohmic contact to silicon carbide therefore generally comprises a high temperature annealing process (e.g., at 900° C. or above) after the deposition of the metal layer on the silicon carbide. The annealing causes a reaction of the metal with the silicon carbide and the formation of silicides, carbides, and/or ternary phases. These compounds may have an electron affinity which is close to that of silicon carbide and may consequently lower the Schottky barrier height and/or the barrier thickness such that an ohmic behavior of the contact is obtained.

Various materials for forming an ohmic contact to silicon carbide have been investigated, both in terms of structural characterization and of electrical performances. Nickel (Ni) is typically used for forming an ohmic contact to n-type silicon carbide. Ni films deposited on n-type silicon carbide and subjected to an annealing at temperatures in the range from about 900° C. to 1000° C. can provide good ohmic contacts with specific contact resistance values as low as about $1 \cdot 10^{-6}$ Ωcm².

Formation of an ohmic contact to p-type silicon carbide is more difficult than to n-type silicon carbide because of the larger values of the Schottky barrier height. Aluminum (Al), titanium (Ti) or combinations thereof (e.g., an Al/Ti stack or an Al/Ti alloy) have been considered as potential contact metals to p-type silicon carbide and, after high temperature annealing at 1000° C. or above, can yield an ohmic contact having a specific contact resistance in the range between $1 \cdot 10^{-4}$ cm² and $1 \cdot 10^{-5}$ Ωcm² (J. Crofton et al., "Titanium and Aluminum-Titanium ohmic contacts to p-type SiC", Solid-State Electronics 41, (1997) 1725-1729; B. J. Johnson et al., "Mechanism of ohmic behavior of Al/Ti contacts to p-type 4H—SiC after annealing", J. Appl. Phys. 95, (2004) 5616-5620).

However, already at annealing temperatures above 800° C., the top layer of an aluminum based contact (Al contact) is prone to oxidation, even when performing rapid thermal annealing under gas flow, and this has a negative effect on the electrical properties of the contact (F. La Via et al., "Ohmic contacts to SiC", International Journal of High Speed Electronics and Systems, 15 04, (2005) 781-820). To form Al/Ti based contacts resistant to oxidation, stack sequences comprising palladium (Pd) have been proposed because of its high resistance to oxidation (K. Vassilevski et al., "Phase formation at rapid thermal annealing of Al:Ti:Ni ohmic contacts on 4H—SiC," Mat. Sci. Eng. B 80, (2001) 370-373).

Moreover, when forming an Al/Ti based contact to a p-type silicon carbide layer, due to the high annealing temperatures required, there is the problem of spiking. Spiking refers to formation of Al filled cavities (so called spikes) in the p-type silicon carbide layer due to diffusion of silicon (Si) into the metallization and diffusion of Al into the p-type silicon carbide layer. When penetrating through an underlying p-n junction these spikes negatively affect the quality of the p-n junction and may lead to an enhanced leakage current or reduced breakdown voltage.

A further disadvantageous effect of having such high annealing temperature is that it may lead to an increased roughness of the contact and this can give serious problems during photolithography alignments.

Moreover, many semiconductor devices such as metal oxide-semiconductor field-effect transistors (MOSFETS) require a layer of a semiconductor oxide (e.g., silicon dioxide). However, the high annealing temperatures associated with contact metal annealing processes place high stress on these oxide layers, which can damage oxide layers, or the semiconductor-oxide interface. Alternatively, forming the ohmic contact prior to creating the oxide layer is not practical because the oxidizing environment utilized to form the oxide layer has adverse effects on the metal contact.

In view of the above problems, alternative approaches were investigated with the aim to reduce the annealing temperature, however with rather limited success. For example, Ge/Ti/Al contacts showed ohmic behavior (with an average specific contact resistance of $1·10^{-4}$ $\Omega cm^2$) already after annealing at 600° C. in ultrahigh vacuum, however they present a high surface roughness, which is undesired for photoresist processing (T. Sakai, "Ternary TiAlGe ohmic contacts for p-type 4H—SiC", J. Appl. Phys. 95, (2004) 2187-2189). A structure fabricated by a sequential evaporation of a Si/Co structure, sintered by a two-step annealing process in vacuum (at 500° C. and 900° C. respectively), was also shown to achieve a low specific contact resistance in the $4·10^{-6}$ $\Omega cm^2$ range. However, a degradation of the electrical properties of the sintered Co/Si/SiC contacts was observed after a high temperature reliability test at 1100° C., most probably as a consequence of a morphological change of the CoSi2 layer (N. Lundberg et al., "Thermally stable low ohmic contacts to p-type 6H—SiC using cobalt silicides," Solid-State Electron. 39, (1996) 1559-1565).

From U.S. Pat. No. 5,409,859 it is further known an ohmic contact to silicon carbide in which platinum (Pt) is used as the contact metal instead of Al, and because of its characteristics as a noble metal such a contact metal can withstand annealing while retaining ohmic characteristics of the ohmic contact. Therein, the silicon carbide comprises a heavily doped p-type layer at the interface to the platinum at a sufficiently high dopant concentration ($>1·10^{19}$ $cm^{-3}$) to reduce the width of the depletion region at interface between the platinum and the heavily doped layer to allow carrier (electron) tunneling transport across the interface. The heavily doped layer may be an epitaxial layer or may be formed by high temperature ion implantation as, for example, described in U.S. Pat. No. 5,087,576. According to this method, during ion implantation, the silicon carbide is heated to a temperature of 600° C. or greater to prevent amorphization of, and minimize damage to, the silicon carbide crystal lattice during the ion bombardment. After the implantation step, the doped layer is annealed at a temperature of 1500° C. to encourage the implanted dopant ions to move to and occupy substitutional lattice sites thereby electrically activating the implanted dopant ions (activation step). The ion implantation step can either precede or follow step of depositing the platinum. Further, it is considered to be advantageous, after the deposition of the platinum layer on the silicon carbide, to perform an additional platinum annealing step at temperatures exemplarily as high as 900° C. to form platinum silicide. However, the equipment required for this ion implantation technique is specialized and expensive and also is platinum compared to aluminum.

In view of the above, a need for a method for forming an ohmic contact to a p-type silicon carbide layer that can reduce the thermal budget to the device still exists. Further, there is a need to a method for forming an ohmic contact to a p-type silicon carbide layer that is efficient and economic.

SUMMARY

Embodiments of the present invention relate to a method for forming an ohmic contact to a p-type silicon carbide layer. Particular embodiments relate to a method that allows formation of ohmic contacts to a p-type silicon carbide layer without annealing.

Embodiments of the invention can provide a method for forming an ohmic contact to a p-type silicon carbide layer that does not necessarily require an annealing step and which is efficient and economic. Further embodiments of the invention provide a semiconductor device manufactured by this method.

In a first step of the method according to the invention, the p-type silicon carbide layer having a first main side and a second main side opposite to the first main side is provided. In a second step first ions and second ions are implanted into the p-type silicon carbide layer from the first main side to form an implantation layer adjacent to the first main side. The step of implanting the ions into the p-type silicon carbide layer is performed by plasma immersion ion implantation (PIII), wherein the p-type silicon carbide layer is (at least partially) immersed in a plasma comprising the first ions and the second ions, the first ions being ionized aluminum (Al) atoms and the second ions being different from the first ions. The junction between the implantation layer and the p-type silicon carbide layer is the ohmic contact.

When ions are implanted into a p-type silicon carbide layer by plasma immersion ion implantation using a plasma comprising ionized aluminum atoms and second ions (e.g., ionized molecules comprising the element aluminum (Al), ionized compounds comprising the element Al, and/or ionized molecules not comprising the element Al), then the thus formed implantation layer forms an ohmic contact with the p-type silicon carbide layer, even when no high temperature annealing step is performed. This is surprising because when using the conventional ion beam implantation technique (e.g., the one described in U.S. Pat. No. 5,087,576 A) to implant aluminum ions into the p-type silicon carbide layer such a behavior could not be observed without performing a high temperature annealing step (activation step).

As it is known by the skilled person, the conventionally used ion beam implantation technique is a high-precision implantation tool to implant ion of a defined charge-to-mass ratio at an exact energy. In the conventional ion beam implantation technique, an energetic ion beam is obtained from an ion beam source by extracting ions from a plasma and accelerating them using the electric field across a single or multiple aperture grid system. To only implant ions of a specific kind (e.g., only ionized aluminum atoms), the extracted ions also undergo a magnetic ion charge and mass separation. Since the ion beam cross section is usually small compared to the target area to be implanted, the ion beam is raster-scanned across the surface area of the target to obtain large implantation areas with sufficient dose uniformity. Due to the line of sight nature of the technique, a manipulator stage is required which can support the target for rotation in the beam so that all sides of the target can be implanted. This adds cost and complexity, constrains the maximum size of the target which can be implanted, and increases the total time required to obtain satisfactory implantation of all target surfaces for relatively large targets.

Plasma immersion ion implantation (PIII) has been developed as an alternative implantation method with reduced complexity. In the plasma immersion ion implantation technique the target to be implanted is immersed in a plasma generated from a source, and negative high-voltage is applied so as to form a conformal electric sheath (space charge layer) between the target and the plasma. Ions located in or entering the sheath from the plasma side are accelerated by the sheath's electric field and implanted into the target when they impact the target. Important in view of the present invention and in contrast to the conventional ion beam implantation technique, no mass and/or charge separation is performed in PIII, with the consequence that all sorts of positively charged ions (e.g., the first ions and the second ions) comprised in the plasma and subjected to the electric field are implanted into the target. So far, the plasma immersion ion implantation technique is only known as a doping technique, but not for forming an ohmic contact to a p-type silicon carbide layer.

Although the inventors do not wish to be bound by any particular theory, it appears that an aluminum plasma (i.e., a plasma comprising aluminum ions) generated from a source in an plasma immersion ion implantation technique comprises in addition to ionized aluminum atoms (first ions) several other ion species (second ions, e.g., ionized compounds, atoms and/or molecules) which, when implanted together with the ionized aluminum atoms in the p-type silicon carbide layer, form an aluminum and silicon carbide based contact (Al/SiC contact) having ohmic properties. It is conceivable that this happens because, when implanted together, these first ions and these second ions form aluminum based compounds (e.g., silicides, carbides and/or ternary phases) with a more beneficial electron affinity, e.g., an electron affinity closer to the one of the p-type silicon carbide layer, thus lowering the Schottky barrier height. However, when only ions of a single type (e.g., ionized aluminum atoms) are implanted, which is the case in the conventional ion beam implantation technique due to their mass and/or charge based separation, such compounds are not formed and therefore a rectifying behavior is obtained.

In view of the above, in an exemplary embodiment the step of implanting the ions into the carbide layer by plasma immersion ion implantation comprises: a step of positioning the p-type silicon carbide layer in an enclosing chamber; a step of generating from a source comprising aluminum the plasma comprising the first ions and the second ions in which the p-type silicon carbide layer is immersed; independently from the step of generating the plasma, a step of applying a negative voltage between the p-type silicon carbide layer and a ground potential to accelerate the first ions and the second ions in the plasma towards the p-type silicon carbide layer from the plasma surrounding the p-type silicon carbide layer at an ion energy sufficient to implant the first ions and the second ions into the p-type silicon carbide layer.

In an exemplary embodiment, the second ions further comprise at least one of carbon and hydrogen, and a concentration of the at least one of carbon and hydrogen in the plasma is the same or higher than a concentration of aluminum in the plasma.

Here, and in what follows, a concentration of a specific element (e.g., Al, H or C) refers to the number of atoms of this element (including ionized atoms of this element) in a defined volume divided by the defined volume.

In an exemplary embodiment, the source is a gas and comprises at least aluminum and carbon. The gas may also comprise hydrogen. For example, the gas comprises one of trimethylaluminum, triethylaluminum, tri-1-butylaluminum and trimethyl(tri-sec-butoxy)aluminum or any mixture thereof.

According to an exemplary embodiment of the invention, the plasma comprises nitrogen (N) and chlorine (Cl), a concentration of the nitrogen is 10% of the concentration of aluminum in the plasma or less, and a concentration of chlorine in the plasma is less than the concentration of aluminum in the plasma. When nitrogen and/or chlorine is implanted into the p-type silicon carbide layer, compensation effects may be induced. By keeping the concentration of nitrogen and chlorine in the plasma below the above values, these compensation effects can be prevented or at least alleviated.

According to an exemplary embodiment of the invention, the accelerated ions hit onto the first main side with an energy of less than 10 keV.

According to an exemplary embodiment of the invention, the applied voltage is between 1 kV and 10 kV, for example between 3 kV and 7 kV.

According to an exemplary embodiment of the invention, the implantation layer is formed to have a minimal aluminum concentration of at least $1 \cdot 10^{18}$ cm$^{-3}$, or at least $1 \cdot 10^{19}$ cm$^{-3}$. When the implantation layer has an aluminum concentration of at least $1 \cdot 10^{18}$ cm$^{-3}$ the electrical properties of the thus formed ohmic contact can be improved.

According to an exemplary embodiment of the invention, after the ion implantation step, there is a step of forming a metal layer on the first main side in direct contact with the implantation layer. The metal layer comprises one of the contact metals known in the art, for example, aluminum (Al), platinum (Pt), titanium (Ti), copper (Cu), gold (Au), nickel (Ni), etc., or mixtures or alloys thereof. In contrast to the prior art, the metal layer is not necessarily required to achieve the ohmic behavior of the contact but may, for example, serve as a connecting interface, e.g., for facilitating the connection of a second device. Therefore, in contrast to the prior art, the metal layer also does not necessarily need to be annealed and thus can, for example, be removably connected to the implantation layer, e.g., it can be a metal plate or a wire pressed against the implantation layer without annealing. If desired, however, the metal layer can also be irremovably connected to the implantation layer, e.g., deposited on the implantation layer or bonded to the implantation layer, e.g., by wire bonding through copper (Cu). This flexibility offered by the present invention offers significant advantages in device design and manufacture.

As mentioned above, according to the method of the invention, no high temperature annealing step is required after the ion implantation step to activate the implanted ions. Surprisingly, as the inventors found out, such a high temperature activation step may even worsen the ohmic behavior of the contact, or completely prevent it. Although the inventors do not wish to be bound by any particular theory, it appears that this may be due to the fact that the compounds formed in the implantation layer during the plasma immersion ion implantation step (for example aluminum carbides) have a low thermal stability such that they break up at the high temperatures used in the activation step.

Therefore, according to an aspect of the invention, during and after the implantation step and before the metal layer forming step a temperature of the p-type silicon carbide layer is kept below 1300° C., or below 1000° C. In other words, no activation step is performed. According to an exemplary embodiment, during and after the ion implantation step a temperature of the p-type silicon carbide layer is permanently kept below 1300° C., or below 1000° C.

As mentioned above, in contrast to the prior art, when forming the ohmic contact, the metal layer also does not necessarily need to be annealed to obtain the ohmic behavior. Also, since the ion energies are lower than in the conventional ion beam implantation technique, the p-type silicon carbide layer does not need to be heated to an elevated temperature to prevent amorphization of and minimize damage to the crystal lattice of the p-type silicon carbide layer during ion implantation. Therefore, according to an aspect of the invention, a temperature of the p-type silicon carbide layer is kept below 500° C., or below 100°

C., during the ion implantation step and below 800° C., or below 100° C., after the metal layer forming step. According to an exemplarily embodiment, during and after the ion implantation step, a cumulative duration during which the temperature of the p-type silicon carbide layer exceeds 500° C., or 100° C., is less than two minutes.

According to another exemplary embodiment, the concentration of aluminum in the metal layer is less than $1 \cdot 10^{13}$ cm$^{-3}$, a concentration of titanium is less than $2 \cdot 10^{11}$ cm$^{-3}$ and a concentration of nickel is less than $1 \cdot 10^{11}$ cm$^{-3}$, or the metal layer is void of aluminum, titanium or nickel.

According to an aspect of the invention the method is used for manufacturing an ohmic contact in a power semiconductor device, for example a p-i-n diode, a Schottky diode, a junction barrier Schottky (JBS) diode, an insulated gate bipolar transistor (IGBT), a bipolar junction transistor (BJT) or a thyristor.

According to an aspect of the invention, the invention pertains to a power semiconductor device comprising an ohmic contact manufactured according to the method of the invention.

BRIEF DESCRIPTION OF THE DRAWINGS

The foregoing and other objects, advantages and features of the invention, and the manner in which the same are accomplished, will become more readily apparent upon consideration of the following detailed description of the invention taken in conjunction with the accompanying drawings, which illustrate exemplary embodiments, and wherein.

The reference signs used in the figures and their meanings are summarized in the list of reference signs. Generally, similar elements have the same reference signs throughout the specification. The described embodiments are meant as examples and shall not limit the scope of the invention.

The following reference numerals can be used in conjunction with the drawings:
 1 p-type silicon carbide layer
 2 enclosing chamber (of a PIII apparatus)
 3 plasma (surrounding the target)
 7 voltage source
 8 ground
 11 implantation layer
 12 n$^-$-type silicon carbide layer
 13 n-type silicon carbide layer
 15 target
 18 first main side
 19 second main side
 21 metal layer
 22 cathode layer
 23 anode layer
 26 plasma generator
 31 first ions
 32 second ions
 81 electric line
 82 electric line
 91 stage
 92 support arm
 100 p-i-n diode

DETAILED DESCRIPTION OF ILLUSTRATIVE EMBODIMENTS

FIGS. 1A-1D show steps of a method for forming an ohmic contact to a p-type silicon carbide layer according to an exemplary embodiment. In a first step shown in FIG. 1A, a p-type silicon carbide layer 1 having a first main side 18 and a second main side 19 opposite to the first main side is provided. The p-type silicon carbide layer 1 can comprise a bulk crystal and/or an epitaxial layer and may be of any polytype, for example 4H—SiC or 6H—SiC. The p-type silicon carbide layer 1 is doped, for example with aluminum and/or boron. The p-type doping of the p-type silicon carbide layer 1 may be performed by any of the known methods, for example ion implantation, co-doping during growth by including a p-type dopant source gas in a growth chamber, deposition (e.g., by sputtering, chemical vapor deposition, evaporation etc.) of the dopants on an undoped silicon carbide layer followed by an annealing to diffuse the dopants into the undoped silicon carbide layer, etc. A peak doping concentration of the p-type silicon carbide layer 1 can, for example, be in the range from $1 \cdot 10^{14}$ cm$^{-3}$ to $1 \cdot 10^{18}$ cm$^{-3}$.

Figure 1A:
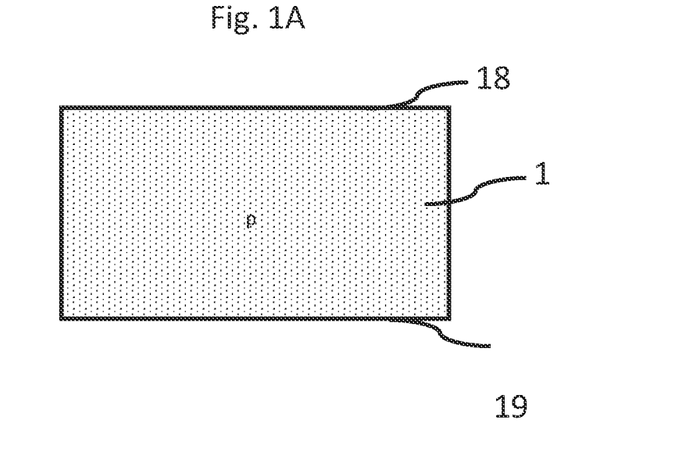
FIG. 1A shows a cross-sectional view of a step of providing a p-type silicon carbide layer.
Figure 1B:
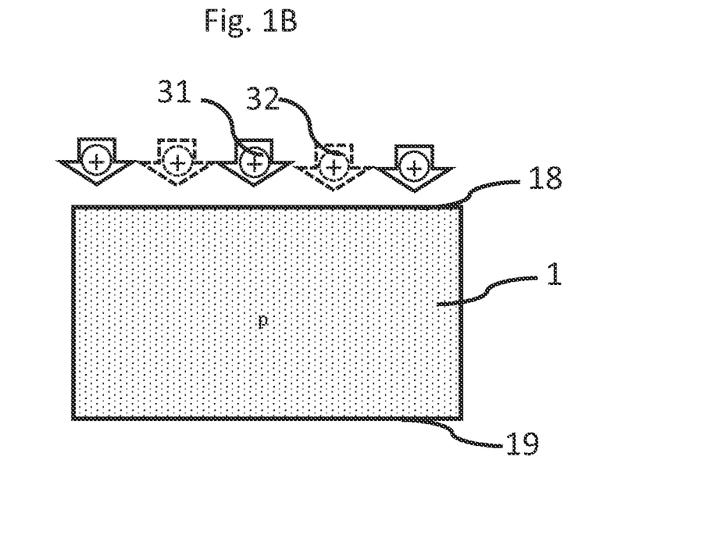
FIG. 1B shows a cross-sectional view of a step of implanting ions at the first main side of the p-type silicon carbide layer.

In a second step shown in FIG. 1B, first ions and second ions are implanted into the p-type silicon carbide layer 1 from the first main side 18 to form an implantation layer 11 (shown in FIG. 1C) at the first main side 18. The ion implantation is done by plasma immersion ion implantation (PIII) and the plasma comprises first ions 31 and second ions 32. The first ions 31 are ionized aluminum atoms. The second ions 32 are different from the first ions 31 and are, for example, ionized molecules comprising aluminum, ionized molecules not comprising aluminum, or ionized atoms not being aluminum. In view of that, it is understood that the second ions 32 may comprise several different ion species, whereas the first ions 31 consists of ionized aluminum atoms.

Figure 2:
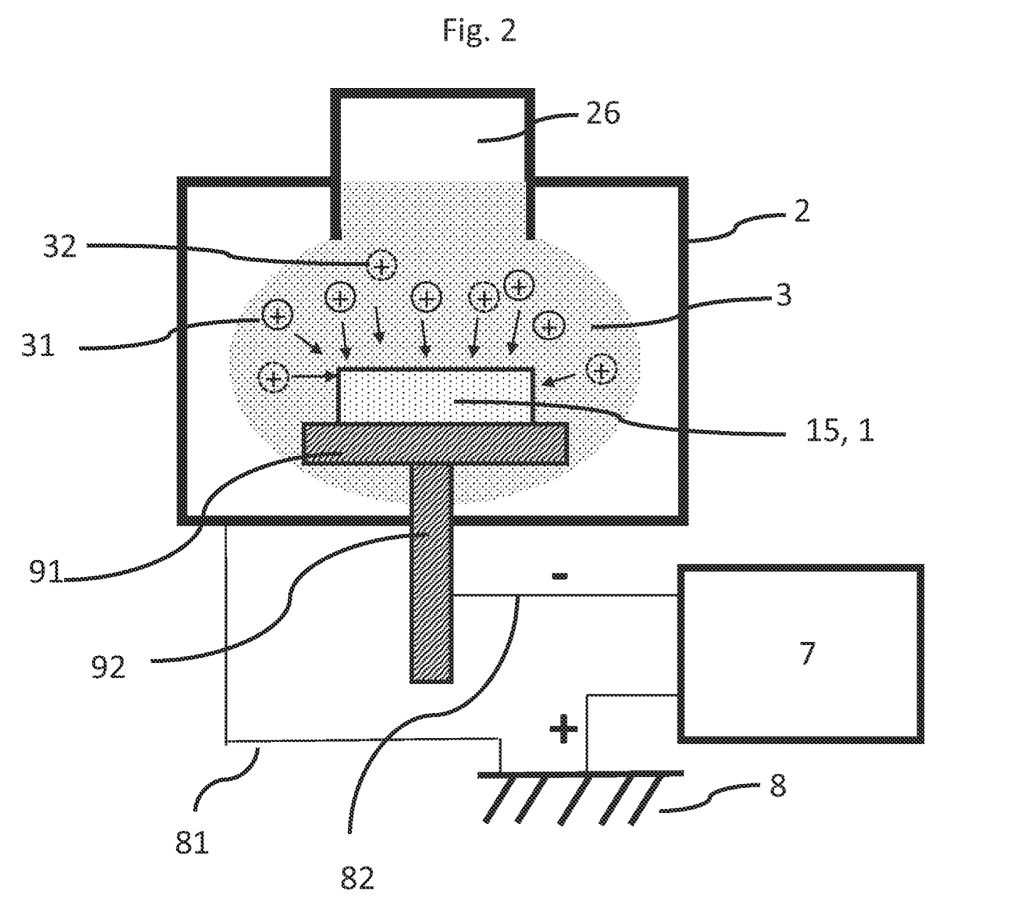
FIG. 2 shows a cross-sectional view of an exemplary plasma immersion ion implantation apparatus.

A schematic illustration of an exemplary plasma immersion ion implantation (PIII) apparatus is depicted in FIG. 2. The apparatus includes an enclosing chamber 2 having conductive walls, e.g., of stainless steel or aluminum. The interior of the enclosing chamber 2 is evacuated by means of a vacuum pump (not shown) in communication with the interior of the enclosing chamber 2, to an operating pressure in the order of, for example, $1 \cdot 10^{-4}$ mbar within the enclosing chamber 2. All of the walls making up the enclosing chamber 2 are electrically connected together and connected by an electric line 81 to ground 8.

A target 15 (for example the p-type silicon carbide layer 1) is mounted in the interior of the enclosing chamber 2, spaced away from all of the walls of the enclosing chamber 2, on a stage 91 at the end of an electrically conductive support arm 92. The support arm 92 holds the target 15 in a fixed position and is electrically in contact with it, for example by an electrical clamp (not shown). The support arm 92 and parts of the stage 91 may be covered with electrical insulation, so that ions are not attracted to them. The support arm 92 is electrically insulated, by an insulator (not shown), from the conductive wall of the enclosing chamber 2 through which it passes, and the insulator is also formed to provide an air-tight seal to the wall of the enclosing chamber 2 through which it passes.

A voltage source 7 is used to apply a voltage (e.g., a constant voltage or repetitive voltage pulses) through an electric line 82 to the support arm 92 to negatively bias the target 15 with respect to the walls of the enclosing chamber 2. Thus, a negative voltage is applied between the target 15 and a ground potential due to which positive ions (for example the first ions 31 and the second ions 32) comprised in a plasma 3 surrounding the target 15 (for example a plasma 3 into which the target 15 is immersed) are accelerated towards the target 15 and implanted into the target 15 upon impact. The applied voltage determines the implant energy. The negative voltage applied may, for example, be such that the ions (for example the first ions and the second ions 32) are accelerated to have an energy of less than 10 keV, for example in the range between 5 keV and 10 keV. The negative voltage applied is, for example, in a range from 1 kV to 10 kV. An implantation dose is, for example, in a range between $1 \cdot 10^{14}$ cm$^{-2}$ and $1 \cdot 10^{17}$ cm$^{-2}$.

The plasma 3 surrounding the target 15 is generated by a plasma generation system 26. As understood herein, the plasma 3 is a collection of free charged particles moving in random directions and is on the average (i.e., as a whole) electrically neutral but highly electrically conductive. The plasma 3 surrounding the target 15 comprises ionized aluminum atoms (first ions 31) and may be generated by ionizing a neutral source gas (precursor) comprising the desired species to be implanted, for example by heating or subjecting the source gas to a strong electromagnetic field. The plasma 3 may also comprise neutral atoms and/or neutral molecules.

In addition to the first ions 31, the plasma 3 further comprises the second ions 32. The second ions 32 depend on the source gas used and may comprise different ions species. For example, the second ions 32 may comprise carbon (C) and/or hydrogen (H), in form of ionized atoms and/or in form of ionized molecules, and a concentration of C and/or H in the plasma 3 may be the same or higher than a concentration of Al in the plasma 3. Since the target 15 is surrounded by (immersed in) the plasma 3, the first ions 31 and the second ions 32 comprised in the plasma 3 cannot be separated by charge and/or mass (which is in contrast to the conventional ion beam implantation) and are therefore implanted together into the target 15 (this is also illustrated in FIG. 1B). In other words, the first ions 31 and the second ions 32 are simultaneously implanted into the target 15. Here, simultaneously does not necessarily mean that each first ion 31 is implanted into the target 15 at exactly the same time point when a second ion 32 is implanted into the target but is used to differentiate from an implantation where first the first ions 31 are implanted and then, only after the first ions 31 have been implanted, the second ions 32 are implanted.

Moreover, in an exemplary embodiment, a concentration of nitrogen (N) in the plasma may be 10% of the concentration of Al in the plasma or less and a concentration of chlorine (Cl) in the plasma may be less than the concentration of Al in the plasma. By this an electric performance of the contact may be improved because N and Cl are donors in SiC and may compensate acceptors in the p-type silicon carbide layer 1 on which the ohmic contact is formed.

The plasma 3 can be produced remotely from the target 15 as shown in FIG. 2 or by ionizing a source gas surrounding the target 15. Thereby, the target 15 may serve as an electrode. The source gas based on which the plasma 3 is generated comprises Al, and, for example, C and H and may, for example, be one of trimethylaluminum, triethylaluminum, tri-1-butylaluminum and trimethyl(tri-sec-butoxy)aluminum, or any mixture thereof. Other metal-organic compounds comprising Al are also conceivable. The plasma 3 generated from trimethylaluminum may comprise, for example, Al, Al(CH$_3$)$_3$, Al$_2$H$_7$—, Al(CH$_3$)$_3$H—. Various ways to generate a plasma from a source gas are known in the art and may be used herein in the plasma generation system 26. Examples are thermionic discharge, pulsed glow discharge, RF plasma discharge, microwave plasma discharge and so on. Thermionic discharge is based on electron emission from a hot cathode, which generates a plasma by ionization of a background gas. In RF plasma discharge, a plasma is generated by coupling electric power capacitively or inductively in a source gas. In glow discharge a plasma is formed by the passage of an electric current through a gas and in microwave discharge a plasma is generated by means of microwaves.

During and after the implantation process, the temperature of the p-type silicon carbide layer 1 is kept below 1300° C., or below 1000° C., to prevent an activation of the ions implanted into the implantation layer 11. If desired, the implantation may also be performed at a temperature below 500° C. or below 100° C. or at room temperature. Since the equipment for heating the target during implantation is expensive, the ability to perform the implantation at such a low temperature may reduce costs and improve procedural efficiency. Furthermore, when the p-type silicon carbide layer 1 is heated to high temperatures, it must be heated and cooled at a rate that will not produce fractures thereby slowing down the manufacturing process.

Figure 1C:
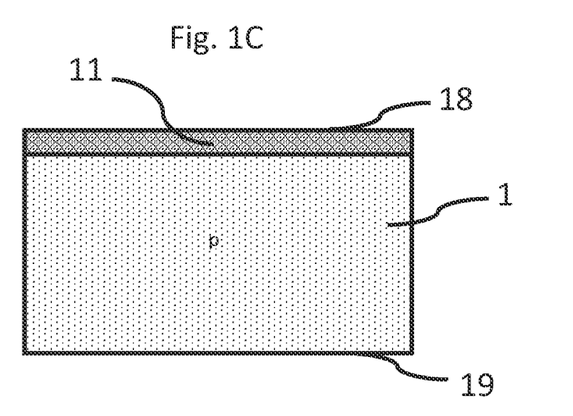
FIG. 1C shows a cross-sectional view of a p-type silicon carbide layer comprising an implantation layer.

FIG. 1C shows the implantation layer 11 implanted by the plasma immersion ion implantation (PIII) process into the p-type silicon carbide layer 1. The implantation layer 11 comprises Al. The concentration of Al in the implantation layer 11 is, for example, at least $1 \cdot 10^{18}$ cm$^{-3}$ or at least $1 \cdot 10^{19}$ cm$^{-3}$, however, lower than $1 \cdot 10^{21}$ cm$^{-3}$ due to solubility reasons. The thickness of the implantation layer 11 is, for example, smaller than 30 nm. Here, and in what follows a thickness of a layer refers to the distance between an upper and a lower surface of the layer and a thickness direction refers to a direction perpendicular to the layer, i.e., perpendicular to the first main side 18 and the second main side 19 of the p-type silicon carbide layer 1.

Figure 1D:
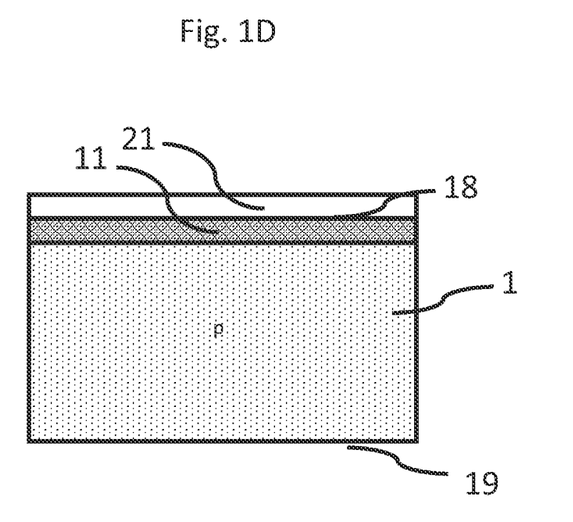
FIG. 1D shows cross-sectional view of a step of forming a metal layer on the first main side of the p-type silicon carbide layer in direct contact with the implantation layer.

After the ion implantation step, if desired, a metal layer 21 may be formed on the on the first main side 18 of the p-type silicon carbide layer 1 in contact with the implantation layer 11. The metal layer 21 is, for example, formed such that it is irremovably connected to the implantation layer 11, for example by sputtering, chemical vapor deposition, bonding or other processes typically used in the art. In a different embodiment, the metal layer 21 may, for example, be pressed against the implantation layer 11 such that it is removably connected to the implantation layer 11. The metal layer 21 may, for example, be a circuit metallization or a wire. The metal of the metal layer 21 may be just about any metal typically used in forming electrical contacts that possesses an appropriately high melting point and vapor pressure and does not interact adversely with the substrate material. For example, the metal layer 21 may comprise one of aluminum (Al), platinum (Pt), titanium (Ti), copper (Cu), gold (Au), nickel (Ni) etc., or combinations (mixtures or alloys) thereof.

According to another exemplary embodiment, the metal layer 21 is essentially void of aluminum, titanium and nickel. For example, in the metal layer 21 a concentration of aluminum is less than $1 \cdot 10^{13}$ cm$^{-3}$, a concentration of titanium is less than $2 \cdot 10^{11}$ cm$^{-3}$ and a concentration of nickel is less than $1 \cdot 10^{11}$ cm$^{-3}$. According to another exemplary embodiment, the metal layer 21 may also be completely void of aluminum, titanium and nickel.

Importantly, when forming the ohmic contact, the metal layer 21 does not need to be annealed in order to achieve the ohmic behavior of the contact. If desired, however, the metal layer 21 can be, provided that the thermal load is kept low enough to prevent breaking up of the compounds formed in the implantation layer 11 by plasma immersion ion implantation. It may be annealed, for example, 10 minutes at a temperature of 1000° C., or at a lower temperature, without destroying its ohmic character. Thus, there is an increased flexibility offered with respect to device design and manufacture.

Figure 3:
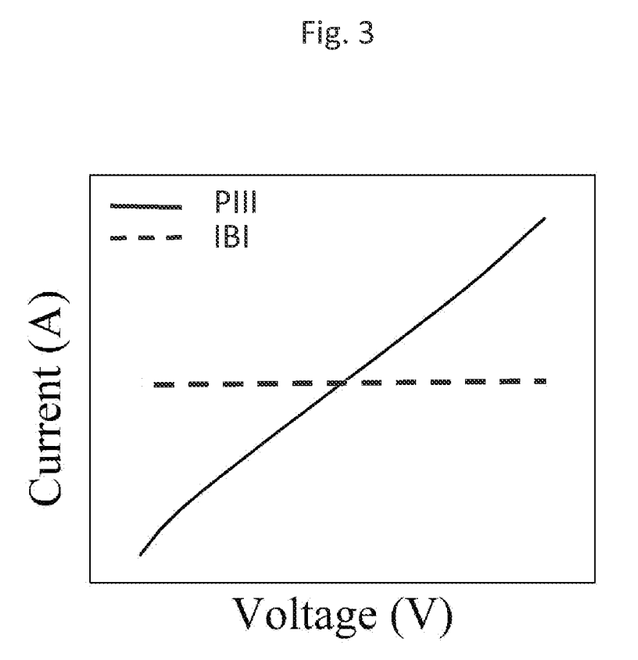
FIG. 3 shows an I-U diagram of an Al/SiC contact formed according to the method of the invention and compared to an Al/SiC contact formed by conventional ion beam implantation.

FIG. 3 shows a I-U diagram of an aluminum/silicon carbide (Al/SiC) contact formed according to the invention by treating as-grown 4H—SiC samples with p-type conductivity (~$3$-$5 \cdot 10^{15}$ cm$^{-3}$) by 5 kV plasma immersion ion implantation (PIII) at room temperature (RT) using trimethylaluminum as a precursor. The implanted dose was $1 \cdot 1016$ cm$^{-2}$. No annealing was performed. Also shown is an I-U diagram of an Al/SiC contact formed by conventional ion beam implantation (IBI) without performing an annealing step. Ohmic behavior is only found in the sample implanted by the method according to the invention.

Figure 4:
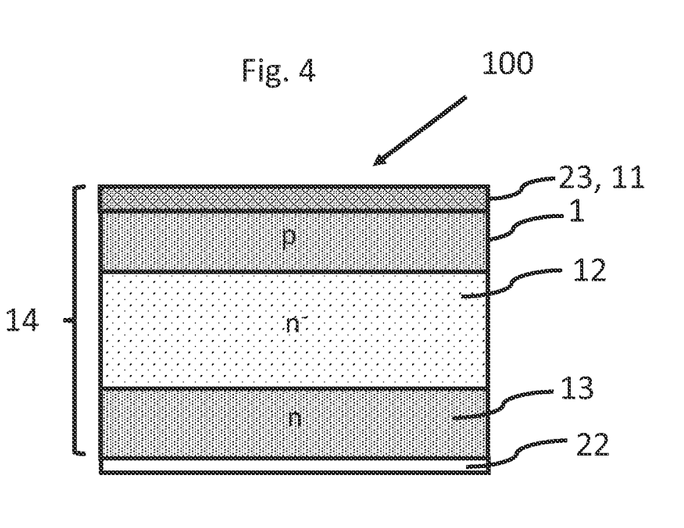
FIG. 4 shows a cross-sectional view of a p-i-n diode as an example of a power semiconductor device fabricated according to the method of the invention.

FIG. 4 shows a p-i-n diode 100 as an exemplary embodiment of a power semiconductor device comprising an ohmic contact manufactured according to the method of the invention. The diode 100 comprises a SiC substrate 14 which comprises in the order from a first side of the substrate 14 to a second side of the substrate 14 opposite to the first side a p-type layer 1, a n$^-$-type layer 12 and a n-type layer 13. Therein, the n$^-$-type silicon carbide layer 12 has a lower doping concentration than the n-type silicon carbide layer 13. At the second side, on the n-type layer 13, the diode 100 comprises a cathode layer 22 forming an ohmic contact with the n-type silicon carbide layer 13. It can be manufactured by conventional methods. At the first side on the p-type silicon carbide layer 1, the diode 100 comprises an anode layer 23, manufactured according to the method of the invention to form an ohmic contact to the p-type layer 1. The anode layer 23 is the implantation layer 11 according to the method. In addition, if desired, an additional metal layer as described above (not shown in FIG. 4) may be formed on the implantation layer 11 to facilitate connection to the device.

In addition, in another exemplary embodiment, the method for forming an ohmic contact to a p-type silicon carbide layer 1 may be part of a method for manufacturing a power semiconductor which is a Schottky diode, a junction barrier Schottky diode, an insulated gate bipolar transistor, a bipolar junction transistor or a thyristor, for example.

It should be noted that the term "comprising" does not exclude other elements or steps and that the indefinite article "a" or "an" does not exclude the plural. Also elements described in association with different embodiments may be combined.

What is claimed is:

1. A method for forming a semiconductor device, the method comprising:
   implanting first ions and second ions into a p-type silicon carbide layer from a first main side to form an implantation layer at the first main side, the implanting being performed by plasma immersion ion implantation in which the p-type silicon carbide layer is immersed in a plasma comprising the first ions and the second ions, the first ions being ionized aluminum atoms and the second ions being different from the first ions.

2. The method according to claim 1, wherein implanting the first and second ions into the p-type silicon carbide layer comprises:
   positioning the p-type silicon carbide layer in an enclosing chamber;
   generating the plasma from a source comprising aluminum; and
   then, independently from generating the plasma, applying a negative voltage between the p-type silicon carbide layer and a ground potential to accelerate the first ions and the second ions in the plasma towards the p-type silicon carbide layer from the plasma surrounding the p-type silicon carbide layer at an ion energy sufficient to implant the first ions and the second ions into the p-type silicon carbide layer.

3. The method according to claim 2, wherein the source comprises a gas comprising aluminum and carbon.

4. The method according to claim 3, wherein the gas comprises trimethylaluminum, triethylaluminum, tri-1-butylaluminum or trimethyl(tri-sec-butoxy)aluminum.

5. The method according to claim 2, wherein the accelerated ions hit onto the first main side with an energy of less than 10 keV.

6. The method according to claim 1, wherein the second ions comprise carbon or hydrogen.

7. The method according to claim 6, wherein a concentration of the carbon or hydrogen in the plasma is the same or higher than a concentration of aluminum in the plasma.

8. The method according to claim 6, wherein the plasma comprises nitrogen and chlorine and wherein a concentration of the nitrogen in the plasma is 10% or less of a concentration of aluminum in the plasma and a concentration of chlorine in the plasma is less than the concentration of aluminum in the plasma.

9. The method according to claim 1, wherein the implantation layer is formed having an aluminum concentration of at least $1 \cdot 10^{18}$ cm$^{-3}$.

10. The method according to claim 1, wherein further comprising performing additional steps to form a power semiconductor device, the power semiconductor device being a p-i-n diode, a Schottky diode, a junction barrier Schottky diode, an insulated gate bipolar transistor, a bipolar junction transistor or a thyristor.

11. A method for forming a semiconductor device, the method comprising:
   implanting first ions and second ions into a p-type silicon carbide layer to form an implantation layer at a first main side, the implanting being performed by plasma immersion ion implantation in which the p-type silicon carbide layer is immersed in a plasma comprising the first ions and the second ions, the first ions being ionized aluminum atoms and the second ions being different from the first ions; and forming a metal layer on the first main side in contact with the implantation layer.

12. The method according to claim 11, wherein during and after implanting the first and second ions and before forming the metal layer a temperature of the p-type silicon carbide layer is kept below 1300° C.

13. The method according to claim 11, wherein during and after implanting the first and second ions and before forming the metal layer a temperature of the p-type silicon carbide layer is kept below 1000° C.

14. The method according to claim 13, wherein the temperature of the p-type silicon carbide layer is kept below 500° during the implanting and wherein the temperature of the p-type silicon carbide layer is kept below 800° C. after the metal layer forming step.

15. The method according to claim 13, wherein the temperature of the p-type silicon carbide layer is kept below 100° during the implanting and wherein the temperature of the p-type silicon carbide layer is kept below 100° C. after the metal layer forming step.

16. The method according to claim 11, wherein the metal layer is void of aluminum, titanium and nickel.

17. The method according to claim 11, wherein the metal layer comprises aluminum, titanium and nickel and wherein a concentration of aluminum in the metal layer is less than $1 \cdot 10^{13}$ cm$^{-3}$, a concentration of titanium in the metal layer is less than $2 \cdot 10^{11}$ cm$^{-3}$ and a concentration of nickel in the metal layer is less than $1 \cdot 10^{11}$ cm$^{-3}$.

18. A method for forming a semiconductor device, the method comprising:
    positioning a p-type silicon carbide layer in an enclosing chamber;
    generating a plasma from a source comprising aluminum; and
    applying a negative voltage between the p-type silicon carbide layer and a ground potential to accelerate first ions and second ions in the plasma towards the p-type silicon carbide layer from the plasma surrounding the p-type silicon carbide layer at an ion energy sufficient to implant the first ions and the second ions into the p-type silicon carbide layer, the first ions being ionized aluminum atoms and the second ions being different from the first ions.

19. The method according to claim 18, wherein the source comprises a gas comprising trimethylaluminum, triethylaluminum, tri-1-butylaluminum or trimethyl(tri-sec-butoxy) aluminum.

20. The method according to claim 18, wherein the accelerated ions hit onto the p-type silicon carbide layer with an energy of less than 10 keV.

21. The method according to claim 18, wherein the second ions comprise carbon or hydrogen.

22. The method according to claim 18, wherein the plasma comprises nitrogen and chlorine and wherein a concentration of the nitrogen in the plasma is less than or equal to 10% of a concentration of aluminum in the plasma and a concentration of chlorine in the plasma is less than the concentration of aluminum in the plasma.

23. The method according to claim 18, wherein a temperature of the p-type silicon carbide layer is kept below 1000° C. while the negative voltage is being applied between the p-type silicon carbide layer and a ground potential.

* * * * *